United States Patent [19]
Takahashi et al.

[11] Patent Number: 5,242,898
[45] Date of Patent: Sep. 7, 1993

[54] METHOD OF FORMING SUPERCONDUCTING CIRCUIT

[75] Inventors: Kenichi Takahashi; Noriyuki Yoshida; Jun Shioya; Yoichi Yamaguchi; Akira Mizoguchi; Noriki Hayashi; Satoshi Takano; Kenji Miyazaki, all of Osaka, Japan

[73] Assignee: Sumitomo Electric Industries, Ltd., Osaka, Japan

[21] Appl. No.: 886,113

[22] Filed: May 19, 1992

Related U.S. Application Data

[60] Division of Ser. No. 766,962, Sep. 25, 1991, which is a continuation of Ser. No. 173508, Mar. 25, 1988, abandoned.

[30] Foreign Application Priority Data

Mar. 30, 1987 [JP] Japan ................................. 62-79361
Apr. 14, 1987 [JP] Japan ................................. 62-91123
Aug. 22, 1987 [JP] Japan ................................. 62-208881

[51] Int. Cl.$^5$ ............................................. H01L 39/00
[52] U.S. Cl. ....................................... 505/1; 505/701; 505/702; 427/62; 427/63; 427/596; 428/210; 428/688; 428/930
[58] Field of Search ................... 505/1, 701, 742, 702; 427/62, 63, 596, 96; 357/5; 428/688, 210, 930

[56] References Cited

U.S. PATENT DOCUMENTS

4,891,355  1/1990  Hayashi et al. ........................ 505/1
5,051,396  9/1991  Yamazaki ............................... 505/1

Primary Examiner—Roy King
Attorney, Agent, or Firm—Pennie & Edmonds

[57] ABSTRACT

A method of forming a superconducting circuit comprises the steps of preparing a ceramics body which is changed from a non-superconductive phase not superconducting at the working temperature into a superconducting phase superconducting at the working temperature by heat treatment and performing the heat treatment on a part of the ceramics body by applying a laser beam to the ceramics body to change the same into the superconductive phase, thereby to form a superconducting circuit consisting of the superconductive phase and the non-superconductive phase on the ceramics body.

3 Claims, 4 Drawing Sheets

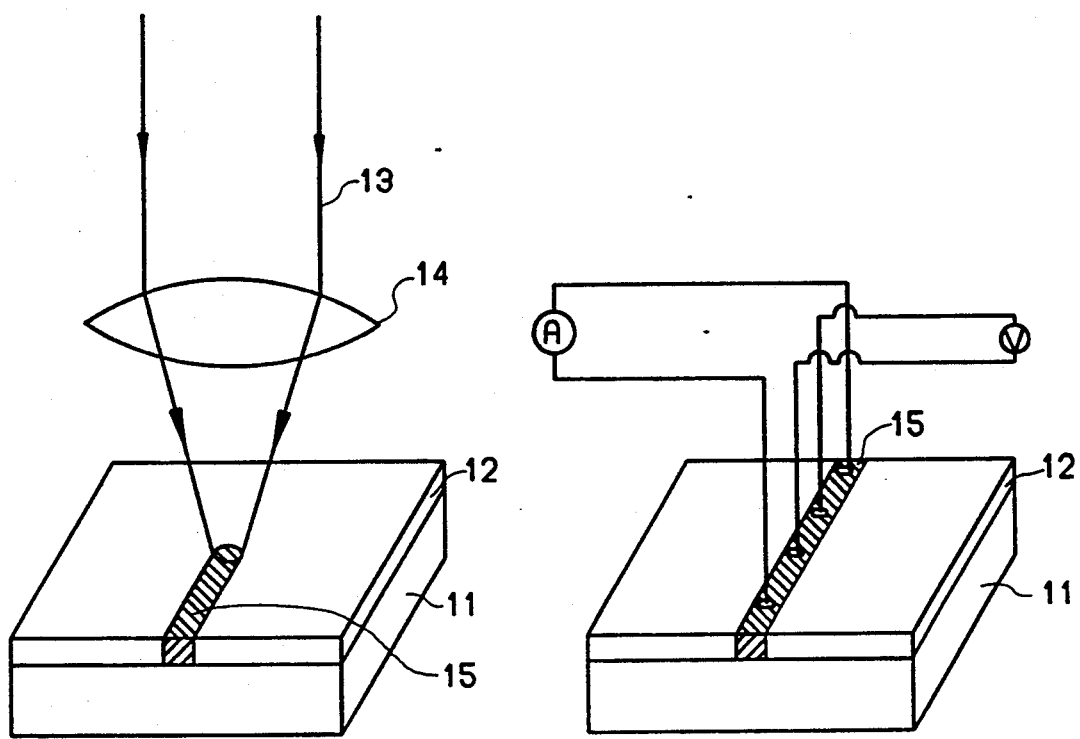
FIG. 6
FIG. 8
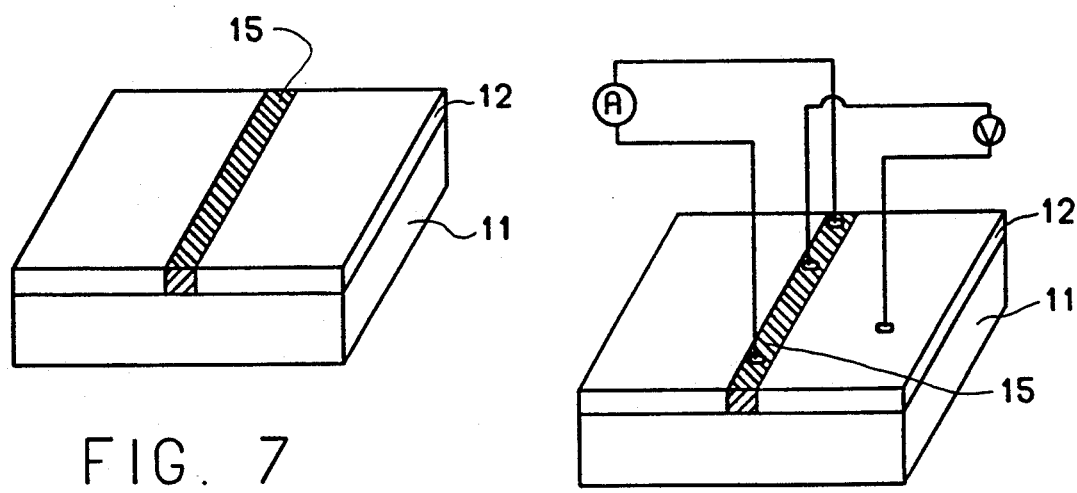
FIG. 7
FIG. 9

METHOD OF FORMING SUPERCONDUCTING CIRCUIT

This is a division, of application Ser. No. 07/766,962, filed Sep. 25, 1991 which is a continuation of Ser. No. 07/173,508, filed Mar. 25, 1988, now abandoned.

BACKGROUND OF THE INVENTION

1. Field of the Invention

The present invention relates to a method of forming a superconducting circuit, and more particularly, it relates to a method of forming a superconducting circuit on a superconductive ceramics material.

2. Description of the Related Art

A superconductive ceramics material is prepared by mixing raw powder materials of oxides, compression-molding the mixture into a prescribed configuration of a block, a sheet or the like and sintering the same, for example. However, it has been difficult to form a fine superconducting circuit by such a method of utilizing compression molding.

In another conventional method of forming a superconducting circuit, a substrate is masked to form a superconducting thin film only on a prescribed portion, thereby to implement a circuit. Alternatively, ion sputtering is performed on a superconducting thin film formed on a substrate to partially scrape off the thin film, thereby to form a circuit.

However, such conventional methods have disadvantages of difficulty in fine working, inferior working accuracy and complicated steps.

SUMMARY OF THE INVENTION

An object of the present invention is to provide a method of forming a superconducting circuit, which enables complex structures to be formed at high accuracy with simple steps.

In the inventive method of forming a superconducting circuit, a ceramic body which can be transformed from a non-superconductor into a material which superconducts at a particular working temperature by heat treatment is prepared. A laser beam is applied to the ceramic body to change desired portions thereof to the superconductor, thereby to form a superconducting circuit consisting of a superconductive phase and a non-superconductive phase on the ceramic body.

The present invention is based on the empirically known phenomenon that a superconductor can be formed or the critical temperature of superconductivity can be substantially increased upon performance of a heat treatment in the process of manufacturing a superconducting ceramic material.

When a laser beam is applied to a part of a ceramic body which is changed from a non-superconductive phase into a superconductive phase by heat treatment, only the part exposed to the laser beam is heated to enter a superconductive phase while the rest remains in a non-superconductive phase. Thus, a complex structure can be formed with dimensions corresponding to the diameter of the laser beam; by applying the laser beam to only a part of the ceramic precursor, a complex superconductive circuit is formed.

The materials for the ceramic body may be selected from a wide variety of materials, given that they contain elements which can form a superconducting substance upon heat treatment. Preferably such raw materials include at least a single element selected from those belonging to the groups Ia, IIa and IIIa of the periodic table, at least a single element selected from those belonging to the groups Ib, IIb and IIIb of the periodic table and at least a single sort of element selected from oxygen, fluorine, sulfur, carbon and nitrogen.

The elements belonging to group Ia of the periodic table are H, Li, Na, K, Rb, Cs and Fr. The elements belonging to group IIa of the periodic table are Be, Mg, Ca, Sr, Ba and Ra. The elements belonging to the group IIIa of the periodic table are Sc, Y, La, Ce, Pr, Nd, Pm, Sm, Eu, Gd, Tb, Dy, Ho, Er, Tm, Yb, Lu, Ac, Th, Pa, U, Np, Pu, Am, Cm, Bk, Cf, Es, Fm, Md, No and Lr.

The elements belonging to groups Ib of the periodic table are Cu, Ag and Au. The elements belonging to group IIb of the periodic table are Zn, Cd and Hg. The elements belonging to groups IIIb of the periodic table are B, Al, Ga, In and Tl.

The raw materials preferably include at least a single element selected from those belonging to the group Ib of the periodic table, at least a single element selected from those belonging to group IIa, at least a single element selected from those belong to the group IIIa and oxygen.

Cu and Ag, particularly Cu, is preferable of the elements belonging to the group Ib of the periodic table and Sr, Ba and Ca are preferable of the elements belonging to the group IIa, while Sc, Y and La are preferable within the elements belonging to the group IIIa.

At least one or two sorts of raw materials containing the aforementioned elements are employed in the form of powder, for example. Such powders may comprise oxides, carbonates, fluorides, sulfides, carbides or nitrides of the aforementioned elements. Of these compounds, oxides or carbonates, particularly oxides are preferable. Further, the raw materials preferably contain at least copper oxide (CuO), in order to obtain a superconductive ceramic material having a high critical temperature.

A ceramics material of the following general formula (1) is preferable because of a relatively high critical temperature:

$$A_a B_b C_c \tag{1}$$

where A represents at least a single element selected from those belonging to the groups Ia, IIa and IIIa of the periodic table, B represents at least a single element selected from groups Ib, IIb and IIIb of the periodic table and C represents at least a single element selected from oxygen, fluorine, nitrogen, carbon and sulfur.

It is known that an oxide containing yttrium, barium and copper has a particularly high critical temperature.

The laser employed according to the present invention are preferably prepared of high output, in order to improve the efficiency of the heat treatment. Examples of the laser are solid-state lasers such as a ruby laser, a glass laser and a YAG laser of $1.06\mu$ in wavelength, gas lasers such as an He-Ne laser, a $Kr^+$ laser, an $Ar^+$ laser, an excimer laser and a $CO_2$ laser of $10.6\mu$ in wavelength, a semiconductor laser and the like. Of these, the $CO_2$ laser and the YAG laser are particularly preferable. The laser beam is preferably converged through a lens to be focused onto the ceramic body, in order to increase heating efficiency. A point of application of the laser beam is preferably moved during its application to the surface of the ceramic body. Alternatively, a spot of prescribed size may be formed on the surface of a substrate in a defocused state for locally heating the same, corresponding to the desired width of an interconnection part of a desired superconducting circuit.

According to one aspect of the present invention, the precursor which is heat treated by the laser beam is formed such that it is crystalline prior to the heat treatment step.

According to another aspect of the present invention, a ceramic body is provided on a substrate in the form of a film. Such a film is formed on the substrate by heating and vaporizing the elements of the desired composition or oxides, salts, etc. of these elements while introducing oxygen, or by sputtering the same.

The film thus formed on the substrate by sputtering or the like is not directly superconductive, or superconducts only at a temperature lower than its desired working temperature. The film will superconduct at the working temperature only after it has been subjected to heat treatment. The ceramic body employed in the present invention is termed a precursor film. According to the invention, a laser beam is applied to such a precursor film to perform heat treatment, thereby forming a superconducting circuit having a superconductive phase only where exposed to the laser beam.

According to another aspect of the present invention, a ceramic body is prepared by molding raw materials and at least preliminarily sintering the same. In other words, the substrate itself is a superconductor precursor, prepared of a ceramic material of superconductive composition, in order to form a superconducting circuit on the surface of the substrate. According to this method, the surface of the ceramic substrate, having been obtained by molding superconductive ceramic raw materials and at least preliminarily sintering the same, in then locally heated by a laser beam, to form an interconnection part of superconductive ceramics on the substrate.

According to this aspect of the invention, the surface of ceramic substrate obtained by molding the superconductive ceramic raw materials and at least preliminarily sintering the same is then locally heated by the laser beam, whereby a homogeneous interconnection of the superconductive ceramic having a high critical temperature can be formed on a surface of the locally heated substrate.

A complex interconnected circuit can thus be provided through such local heating by the laser beam, while the interconnection part of superconductive circuit thus formed is integrated with the ceramic substrate.

In order to obtain further homogeneous ceramic member of a composite oxide etc. having a low melting point, it is preferable to perform a series of steps of molding a mixture of raw materials, preliminarily sintering the same, pulverizing the preliminarily sintered substance at least once to obtain a ceramic powder, molding the ceramic powder and resintering the same to provide a ceramic member.

The aforementioned preliminary sintering step may be performed i various atmospheres, but is preferably performed in the presence of oxygen, e.g., in an oxygen containing atmosphere with oxygen partial pressure of 150 to 760 mmHg, in order to obtain a homogeneous composite oxide while preventing decomposition or reduction of the raw materials. Preliminary sintering conditions such as the heating temperature and the heating time are appropriately selected in response to the raw materials employed.

Even if superconductive ceramic raw materials employed have high melting points, a composite oxide of a low melting point can be obtained through solid phase reaction in a solid phase state by performing the aforementioned series of steps at least once. Thus, a raw material of a superconductive ceramic, generally having a high melting point, must be sintered at a high temperature for a long time. Even if the materials are sintered under such conditions, the surface and the interior of the ceramic material are not necessarily homogeneous. However, a ceramic material homogeneous to the interior can be obtained by performing the aforementioned series of steps at least once. In order to prepare a ceramic material composed of $Y_{0.3}Ba_{0.7}CuO_3$ by sintering $Y_2O_3$, $BaCO_3$ and $CuO$, for example, the raw materials, having high melting points of 1200° to 2700° C. and being hard to melt, must be sintered at a high temperature for a long time. Further, the melting points of these raw materials are extremely different from each other and hence sintering conditions must be selected in response to the raw material having the highest melting point. Even if sintering is performed under these conditions, it is difficult to obtain a ceramic material of homogeneous composition. However, a composite oxide of a low melting point can be generated through the aforementioned series of steps by solid phase reaction in the aforementioned preliminary sintering step. Namely, a mixture of the raw materials is subjected to compression molding, preliminary sintering and pulverizing steps to provide a desired composite oxide having a low melting point of 900° to 1400° C., which is a narrower melting temperature range as compared with the raw materials. Thus, the aforementioned series of steps are performed to facilitate later molding and sintering steps, as well as to obtain a homogeneous ceramic superconductive precursor powder.

The aforementioned series of steps may be performed at least once, responsive to the raw materials employed and the desired composite oxide. Confirmation as to whether or not a desired crystalline composite oxide has been formed can be obtained by analyzer means such as an X-ray diffractometer.

Thus, the number of times the aforementioned series of steps are repeated is selected responsive to whether or not the desired composite oxide has been made, in response to the raw materials employed, the sintering conditions etc. The pulverizing step may be performed employing a ball mill or the like.

The ceramic powder obtained in the aforementioned manner can be easily formed of a homogeneous composite oxide having a low melting point, sintered at a low temperature.

Then, the ceramic powder obtained from the aforementioned raw materials through the aforementioned series of steps is molded and at least preliminarily sintered to provide a ceramic substrate. At least the aforementioned preliminary sintering step may be performed in order to obtain an integrated substrate, while essential firing may be performed to further improve integrity of the substrate. The substrate obtained in the aforementioned manner may superconduct at a low critical temperature, but is converted into a superconductive ceramic having a high critical temperature by subsequent application of a laser beam. When subsequently heat treated, the substrate formed by sintering the aforementioned ceramic powder of a homogeneous composite oxide becomes a superconductor having a high critical temperature. The critical temperature of the substrate can be controlled by adjusting the number of times the aforementioned series of steps are repeated. In the aforementioned molding step, the material can be shaped into an appropriate configuration, a block, a sheet or the like, while preliminary and essential sintering conditions are selected i response to the melting points of the raw materials and the aforementioned ceramics powder and the desired characteristics of the substrate.

In order to form a superconductive phase on the surface of a ceramic member serving as the aforementioned substrate, the surface of the ceramic plate is preferably locally heated by a laser beam in the presence of oxygen. In more concrete terms, a laser beam is passed through a cylindrical body 2 as shown in FIG. 1 and converged into a focused state by a lens 3 held in the cylindrical body 2 to be applied to the surface of a substrate 1 for heating/melting operation. The point of application of the laser beam is moved to form a prescribed interconnection part having a higher critical temperature of superconductivity than the substrate 1. In order to supply oxygen to the surface of the substrate 1, oxygen gas or mixed gas having high oxygen partial pressure is fed to the cylindrical body 2, to be sprayed to the surface of the substrate 1 from a forward end portion of the cylindrical body 2.

This aforementioned heating/melting operation by the laser beam may be performed in the presence of oxygen in order to form a superconducting circuit having a high critical temperature on the surface of the substrate 1, while preventing reduction or decomposition of the oxides forming the ceramics material. The laser beam is preferably applied to the surface of the substrate 1 while supplying oxygen to the substrate surface at a high oxygen partial pressure of 150 to 760 mmHg, for example.

Through such operation, a portion of the superconductive ceramic precursor material of the substrate $1b$ is in part heated/molten by the laser beam, thereby to form a superconducting circuit consisting of the substrate part $1b$ and an interconnection part $1a$ of superconductive ceramic material which has a higher critical temperature than the substrate part $1b$, as shown in FIGS. 2 and 3. Further, a low-temperature operating device 4 such as a SQUID (superconducting quantum interference device) or GaAs HEMT (high electron mobility transistor) can be placed on an interconnection part $1a$ of a substrate 1 as shown in FIG. 4, and be connected through the superconductive interconnection $1a$ of the superconductive ceramic. Thus, according to this aspect, a ceramic body is prepared by molding raw materials and at least preliminarily sintering the same to serve as a substrate. A superconducting circuit is then formed by applying a laser beam to the surface of the substrate. Thus, a substrate integrated with a superconducting circuit can be obtained so that the substrate and the superconducting circuit need not be separately prepared, whereby the manufacturing process can be simplified.

According to the inventive method, a superconducting circuit can be finely worked with improved accuracy as compared with the conventional method, through a simple process of applying a laser beam .

Further, the thickness of the superconductive phase can be adjusted by changing energy of the laser beam.

According to the inventive method, a superconducting circuit can be finely worked with improved accuracy as compared with the conventional method, through a simple process of applying a laser beam.

Further, the thickness of the superconductive phase can be adjusted by changing the energy of the laser beam. The inventive method is effectively applied to manufacture of a switching element, a memory element, a magnetic flux sensor, an amplifier element, a thin motor etc., which are employed in various fields such as electronics and power generation.

In the aforementioned first aspect of the present invention, a ceramic body to be provided with a superconducting circuit is a film formed on a substrate. According to this aspect, the circuit can be simply formed as compared with a conventional method of forming a circuit by performing ion sputtering to form a film over the entire substrate and partially removing the thin film, while the interconnection part of the circuit can be accurately formed.

According to the aforementioned second aspect of the present invention, a ceramic body to be provided with a superconducting circuit is prepared of a ceramic substrate, obtained by molding raw materials and at least preliminarily sintering the same. The superconducting circuit can be integrally formed on the surface of the substrate so that the same need not be prepared separately whereby the manufacturing process can be simplified.

These and other objects, features, aspects and advantages of the present invention will become apparent from the following detailed description of the present invention when taken in conjunction with the accompanying drawings.

BRIEF DESCRIPTION OF THE DRAWINGS

FIG. 6 is a perspective view showing a state during scanning of a laser beam in a fifth embodiment (Example 2) of the present invention;

FIG. 7 is a perspective view showing the device after application of the laser beam in the fifth embodiment (Example 2) of the present invention;

FIG. 8 is a perspective view showing connections for measuring temperature resistance characteristics of a part exposed to a laser beam;

FIG. 9 is a perspective view showing connections for measuring temperature-resistance characteristics where one of the four terminals is connected to a part of the substrate not exposed to the laser beam;

DESCRIPTION OF THE PREFERRED EMBODIMENTS

Description is now made on an embodiment employing a ceramics body formed by a ceramics plate which is obtained by molding raw materials and at least preliminarily sintering the same.

EXAMPLE 1 prescribed amounts of powder materials of $Y_2O_3$, $BaCO_3$ and $CuO$, being raw materials for a ceramic body, were weighed and mixed with each other. Such mixed powder was compression-molded into a sheet at ambient temperature in the atmospheric air of 100 atm., and preliminarily sintered in a mixed gas atmosphere of oxygen gas and nitrogen gas with oxygen gas partial pressure of 200 mmHg at 940° C. for 24 hours. A preliminarily sintered ceramics body thus obtained was pulverized by a ball mill. Such series of steps were repeated until a composite crystalline oxide of $Y_{0.3}Ba_{0.7}CuO_3$ was obtained as confirmed by X-ray diffraction.

A ceramic powder of the composite oxide obtained in the aforementioned manner was compression-molded into a sheet and sintered air at 800° C. for two hours, to prepare a substrate. A beam of 1 to 10 W from a $CO_2$ laser was converged to about 0.1 mm in diameter to locally heat/melt the surface of the substrate while spraying oxygen gas onto the substrate surface. Such a local heating point was moved to form a prescribed interconnection pattern. Finally heat treatment was performed under an oxygen atmosphere in a heat treating furnace at 700° C. for five hours.

Figure 1:
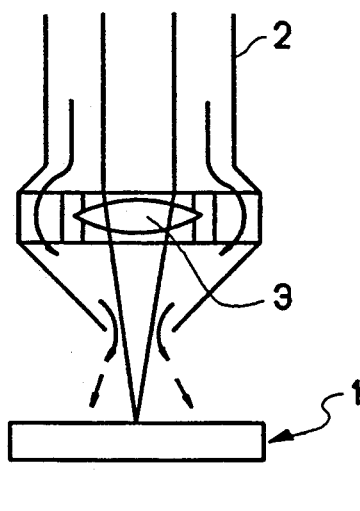
FIG. 1 schematically illustrates an exemplary step of performing heat treatment by a laser beam in a method according to the present invention.
Figure 2:
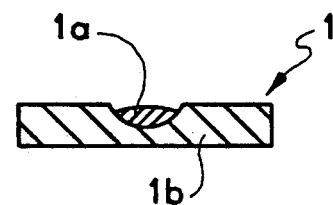
FIG. 2 is a schematic sectional view showing a ceramic body which is formed with a superconducting circuit according to a first embodiment of the present invention.
Figure 3:
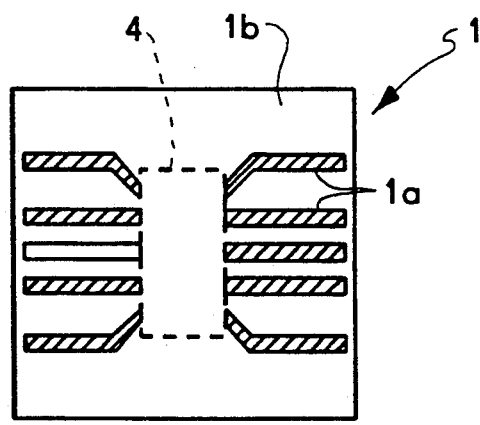
FIG. 3 is a plan view schematically showing a ceramic body which is formed with a superconducting circuit according to a second embodiment of the present invention.
Figure 4:
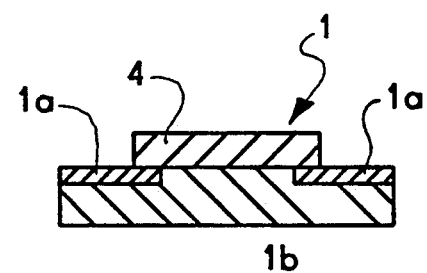
FIG. 4 is a sectional view schematically showing an example of a device employing a ceramic body formed with a superconducting circuit according to a third embodiment of the present invention.
Figure 5:
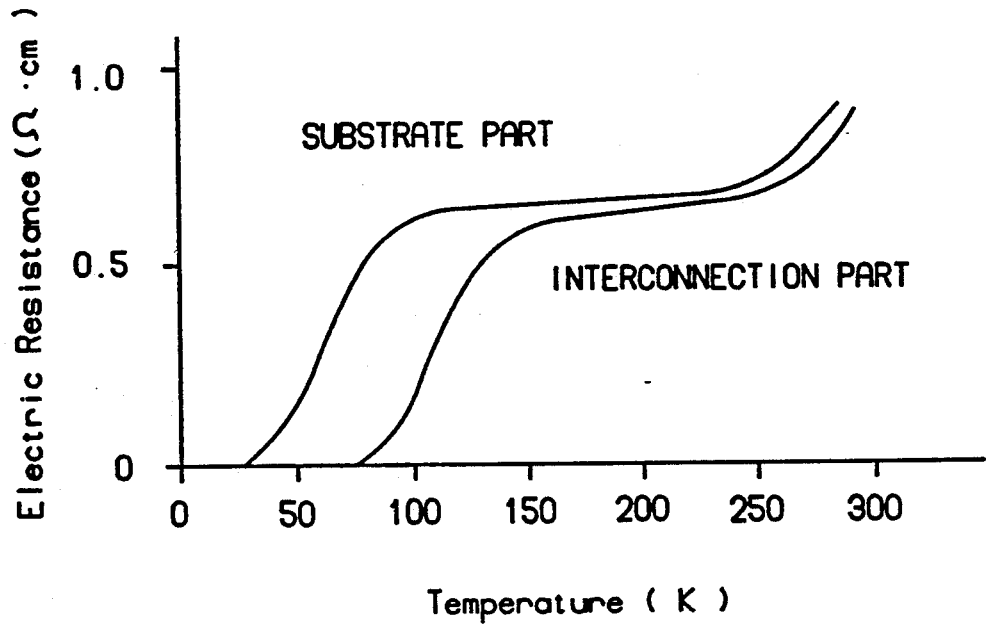
FIG. 5 illustrates the result of a fourth embodiment (Example 1) of the present invention.

As a result of measurement of critical temperature based on electric resistance, it was determined that the interconnection part which was heated/molten by the laser beam superconducted at a temperature of approximately 80 K. while the substrate part superconducted at a temperature of not more than 30 K., as shown in FIG. 5. Thus, it can be seen that the substrate part is non-superconductive and the interconnection part makes up a superconducting circuit if the device is cooled to a temperature in a range of 30 to 80 K.

A description is now provided of another embodiment employing of the invention a ceramic body including a film formed on a substrate.

EXAMPLE 2

A film $0.5\mu$ thick composed of $YBa_{1.8}Ca_{2.7}O_x$ was formed on the (100) surface of a strontium titanate substrate of $15 \times 15$ mm. In an atmosphere of argon-oxygen mixed gas containing 10% of oxygen, of a pressure of $1 \times 10^{-2}$ Torr, and with a substrate temperature of 600° C. The film thus formed was not directly superconductive.

A laser beam was applied onto the film as shown in FIG. 6. Referring to FIG. 6, numeral 11 indicates the substrate, numeral 12 indicates the film, numeral 13 indicates the laser beam, numeral 14 indicates a lens of zinc selenide (ZnSe), and numeral 15 shows a part exposed to the laser beam in cross-hatching. It is to be noted that, in FIG. 6, the film 12 is shown in an enlarged manner as compared with actual size. The laser beam 13 was provided by a $CO_2$ laser of $10.6\mu$ wavelength with power of 20 W/cm2 and a scanning rate of 0.01 mm/sec. The ZnSe lens 14 was adapted to converge the laser beam 13 to a spot of 1 mm diameter.

A platinum/platinum-rhodium thermocouple was placed in the vicinity of the exposed part 15 to measure the temperature thereof, which was 880° to 940° C.

An exposed part 15 as shown in FIG. 7 was formed on the film 12 by the aforementioned scanning of the laser beam 13. As shown in FIG. 8, copper wires were interconnected to exposed part 15 to measure temperature-resistance characteristics. The so-called critical temperature at which the resistance was less than $10^{-7}$ ohms, the limit of the measuring apparatus, was 78 K.

When one of the four terminals as interconnected to a part not exposed to the laser beam, as shown in FIG. 9, no superconductivity was detected, even at the temperature of liquid helium (4 K.).

Thus, it was confirmed that only the exposed part 15 was superconductive. Referring to FIGS. 6 to 9, identical reference numerals indicate the same components.

The laser beam 13 was applied in an oxygen atmosphere in this Example. Such an oxygen atmosphere may be implemented by introducing an appropriate amount of oxygen into a vessel, or by spraying oxygen on the exposed part 13. It is not necessarily required according to the present invention to apply the laser beam in an oxygen atmosphere, although this step will often improve the superconductive characteristics of the film.

A film prepared under the conditions of this Example was subjected to heat treatment in oxygen of a substrate temperature of 900° C. for two hours without exposure to a laser beam, whereby the so-called critical temperature, at which electric resistance substantially reached zero, was improved further to 84 K.

EXAMPLE 3

Figure 10:
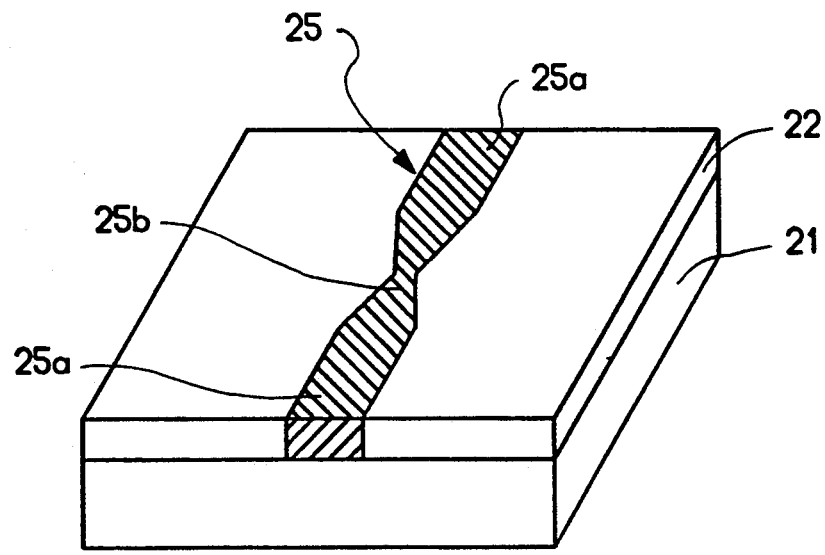
FIG. 10 is a perspective view for illustrating a sixth embodiment (Example 3) of the present invention.

As shown in FIG. 10, a film 22 was formed on a substrate 21 in a similar manner to Example 2, and a part 25 was exposed to a laser beam. Wide portions 25a of the exposed part 25 were formed by scanning of a laser beam having a spot of 1 mm diameter at a scanning rate of 1 mm/sec. Finally heat treatment was performed under an oxygen atmosphere in a furnace at 800° C. for two hours.

Figure 11:
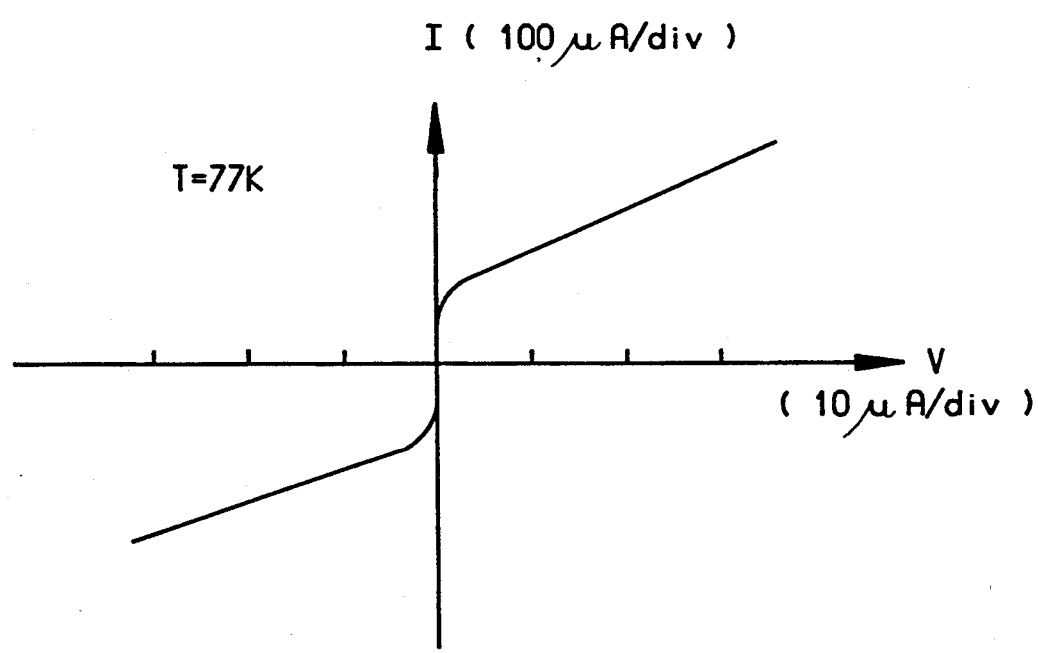
FIG. 11 illustrates current-voltage characteristics of a bridge type Josephson junction device obtained by the sixth embodiment (Example 3) of the present invention.

Copper wires were interconnected to the wide portions 25a on both sides of the junction portion 25b respectively, to measure current-voltage characteristics at 77 k. FIG. 11 shows the result. As obvious from FIG. 11, it has been confirmed that the junction portion 25b of the exposed part 25 served as a bridge type Josephson device.

EXAMPLE 4

In this example, lanthanum was the element belonging to the group IIIa of the periodic table, strontium the element belonging to the group IIa of the periodic table and copper the element belonging to the group Ib of the periodic table. A ceramic substrate 32 was set in a vacuum chamber to be heated to about 100° to 1000° C. Then, crucibles containing lanthanum, strontium and copper were heated to 100° to 1000° C. respectively. After vapor pressures of the respective elements were thus obtained to some extent, oxygen was introduced from a nozzle 35 (FIG. 12) provided in the vicinity of the substrate 32, and finally shutters provided over the sources of the vapors of the respective elements were opened, thereby to perform vapor deposition on the substrate 32.

Such a substrate 32 can a ceramic plate of Al2O3, BN or the like.

Figure 12:
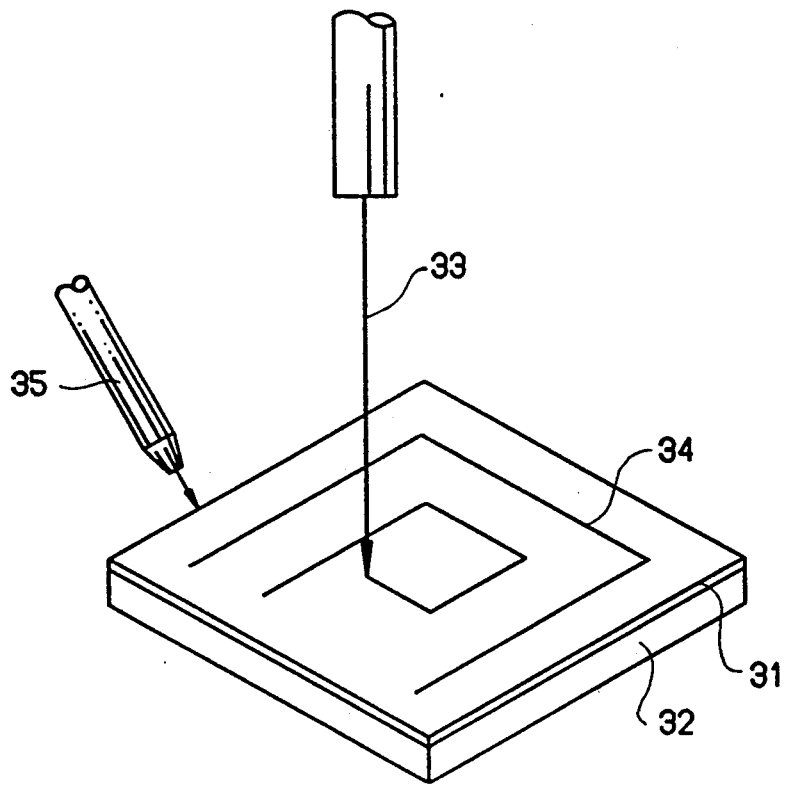
FIG. 12 is a perspective view showing a seventh embodiment (Example 4) of the present invention.

The thin film 31 thus formed was then exposed to a laser beam 33, which was restricted in beam diameter, in the air or with spraying of oxygen as shown in FIG. 12. Thus, a part of the thin film 31 exposed to the laser beam 33 was heated to about 1000° C. to be sintered, thereby to provide superconductive phase 34 having a characteristic superconductive crystal structure.

Thus, the superconductive phase 34 could be formed by scanning of the laser beam 33.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A superconducting circuit consisting of a high Tc superconductive phase and a non-superconductive phase formed by the steps of:

preparing a crystalline ceramic body of a material capable of being converted by heat treatment in the presence of oxygen from a phase which is not superconductive at a working temperature in a phase which is superconductive at said working temperature; and applying a laser beam to said crystalline ceramic body in the presence of oxygen, to perform said heat treatment on part of said crystalline ceramic body, thereby to convert said part of said crystalline ceramic body into said superconductive phase.

2. A superconducting circuit in accordance with claim 1, wherein said raw material of said crystalline ceramics body comprises copper, oxygen and at least two elements selected from the group consisting of Mg, Ca, Sr, Ba, Y, La, Ce, Pr, Nd, Pm, Sm, Eu, Gd, Tb, Dy, Ho, Er, Tm, and Yb.

3. A superconducting circuit in accordance with claim 2, wherein said material of said crystalline ceramic body comprises yttrium, barium, copper and oxygen.

* * * * *